United States Patent [19]

Tracy et al.

[11] Patent Number: 4,615,755

[45] Date of Patent: Oct. 7, 1986

[54] WAFER COOLING AND TEMPERATURE CONTROL FOR A PLASMA ETCHING SYSTEM

[75] Inventors: David H. Tracy; Paul G. Saviano, both of Norwalk, Conn.

[73] Assignee: The Perkin-Elmer Corporation, Norwalk, Conn.

[21] Appl. No.: 763,165

[22] Filed: Aug. 7, 1985

[51] Int. Cl.$^4$ .......................... B44C 1/22; C03C 15/00
[52] U.S. Cl. ..................................... 156/345; 156/626;
156/643; 204/192.32; 204/298
[58] Field of Search ....................... 156/345, 643, 626;
204/192 E, 298

[56] References Cited

U.S. PATENT DOCUMENTS 4,565,601 1/1986 Kakehi et al. ................... 204/192 E

FOREIGN PATENT DOCUMENTS 0140755 5/1985 European Pat. Off. ............ 156/345

Primary Examiner—Arthur Kellogg
Attorney, Agent, or Firm—Thomas P. Murphy; Edwin T. Grimes; Francis L. Masselle

[57] ABSTRACT

Pressurized gas is applied between a wafer and electrode in a plasma etching system. Gas between the wafer and electrode provides cooling of the wafer. A control arrangement maintains the gas at a predetermined pressure.

9 Claims, 2 Drawing Figures

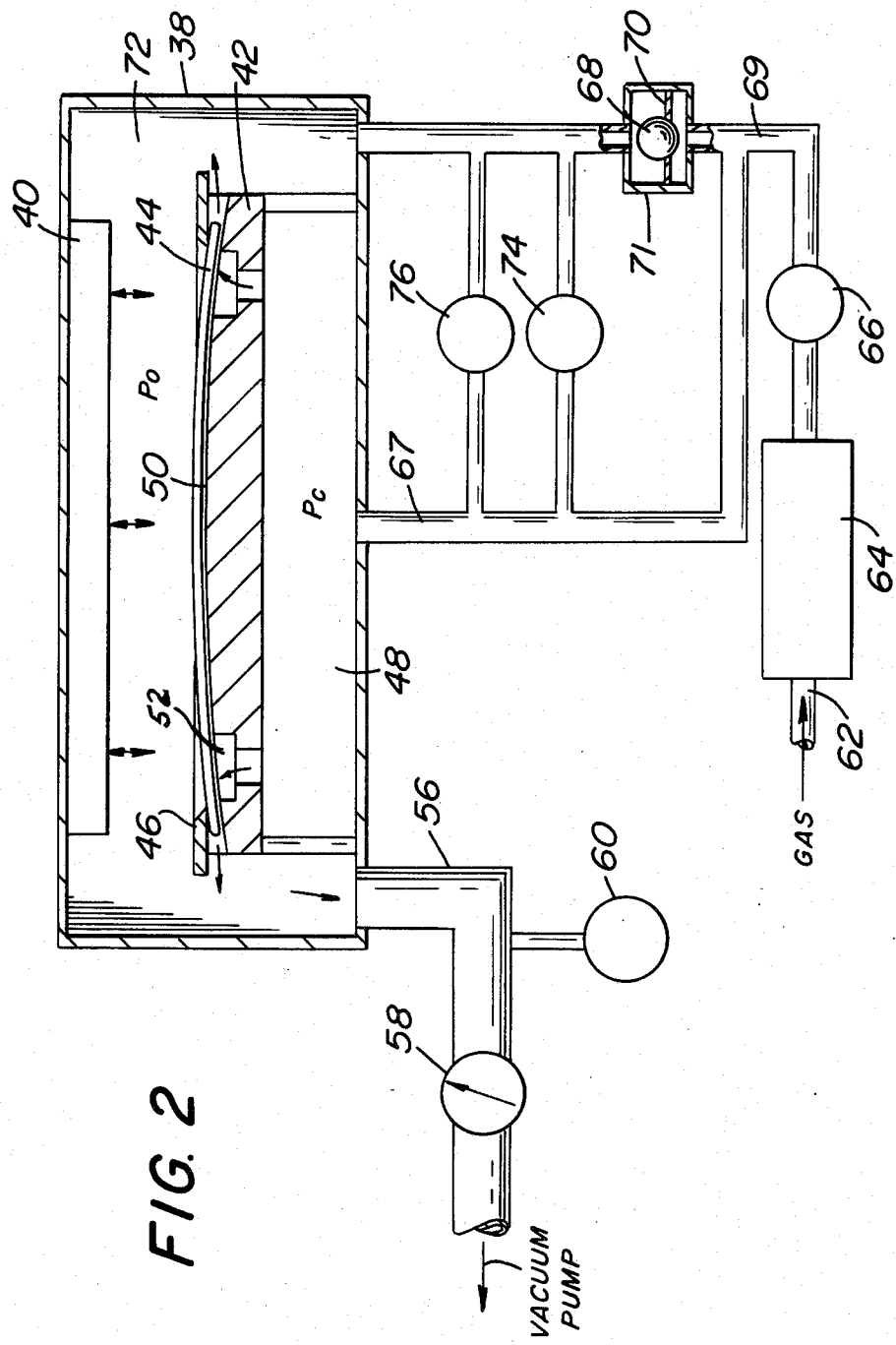

WAFER COOLING AND TEMPERATURE CONTROL FOR A PLASMA ETCHING SYSTEM

BACKGROUND OF THE INVENTION

Cooling of different elements in plasma etching systems is important in order to achieve consistent etching over a large number of operations and to optimize etch results. For example, it is common to provide liquid cooling to the counter electrode and to the chuck electrode.

A wafer including a film to be etched and generally disposed on the chuck electrode is subjected to a heat flux resulting from the plasma within the reactor. The heat flux comprises a large fraction of the R.F. power delivered to the reactor. In the course of etching, the wafer temperature rises until the heat transfer to the chuck equals the heat input from the plasma.

The temperature of the wafer surface is a significant variable in many plasma etch processes. Excessive and variable temperatures have a great effect on resist degradation and process selectivities. Reliable control of wafer temperature rise and uniformity is difficult to achieve because of variability in the heat input to the wafer and inadequacy of the cooling processes which limit the temperature rise. Also, wafer temperature has not been independently controllable in the past. Instead, the temperature of the wafer has depended to an important degree upon such parameters as R.F. power, process gas pressure, and wafer flatness and has frequently been excessively high.

A well-recognized source of the problem of cooling the wafer is the difficulty in efficiently transferring heat from the wafer to the chuck electrode when low gas pressures and low contact pressures are involved. The wafer temperature can easily rise 100° C. or more above that of the chuck electrode which makes very difficult to achieve effective control by way of the chuck electrode temperature even when the chuck electrode is independently cooled. Also, the time constant of the thermal equilibration is tens of seconds when the thermal clamping is weak, which means that the wafer temperature is not even approximately constant during the etch.

OBJECTS OF THE INVENTION

It is an object of this invention to provide an improved arrangement for transferring heat from a wafer to a chuck electrode in a plasma etching system.

It is a further object of this invention to provide improved heat transfer from a wafer to a chuck electrode in a plasma etching system which does not affect the electrical coupling between the wafer and chuck electrode or adversely affect the chemistry involved in the etching process.

It is still a further object of this invention to provide a system for transferring heat from a wafer to a chuck electrode by a gas film and for controlling the pressure of the gas film.

It is still a further object of this invention to provide an improved shaped chuck electrode including an improved means for applying pressurized gas therethrough.

It is still a further object of this invention to provide an improved etching system which avoids reticulation (burning) of a photoresist, the using of excessively low chuck temperature and expensive coolers. and the use of high process gas pressure to promote wafer cooling.

It is still a further object of this invention to provide improved selectivity to the photoresist used and the types of substrate films used.

It is still a further object of this invention to provide a system which permits higher R.F. densities to be used without excessive wafer temperature.

BRIEF SUMMARY OF THE INVENTION

In accordance with the present invention, a plasma etching system includes a reactor having a process chamber including a pair of electrodes for receiving a process gas therein. A wafer having a film to be etched is disposed on one of the electrodes (chuck electrode). Pressurized gas is applied to the interface between the wafer and chuck electrode by means of a circular distribution groove to cause heat to be transferred between the wafer and the chuck electrode. A clamp ring conforms the wafer to the chuck electrode, which is domed, and provides the force necessary to balance the pressure of the gas under the wafer. Control devices are employed to maintain the pressure of the gas between the wafer and chuck electrode at a predetermined level without variation in the partial pressure of heat transfer gas reaching the process chamber.

Other objects and advantages of the present invention will be apparent and suggest themselves to those skilled in the art, from a reading of the following specification and claims in conjunction with the drawings.

BRIEF DESCRIPTION OF THE DRAWINGS

FIG. 2 is a diagram including many of the elements of FIG. 1, with devices for maintaining a relatively constant gas pressure between the chuck electrode and wafer being included.

DESCRIPTION OF THE INVENTION

Figure 1:
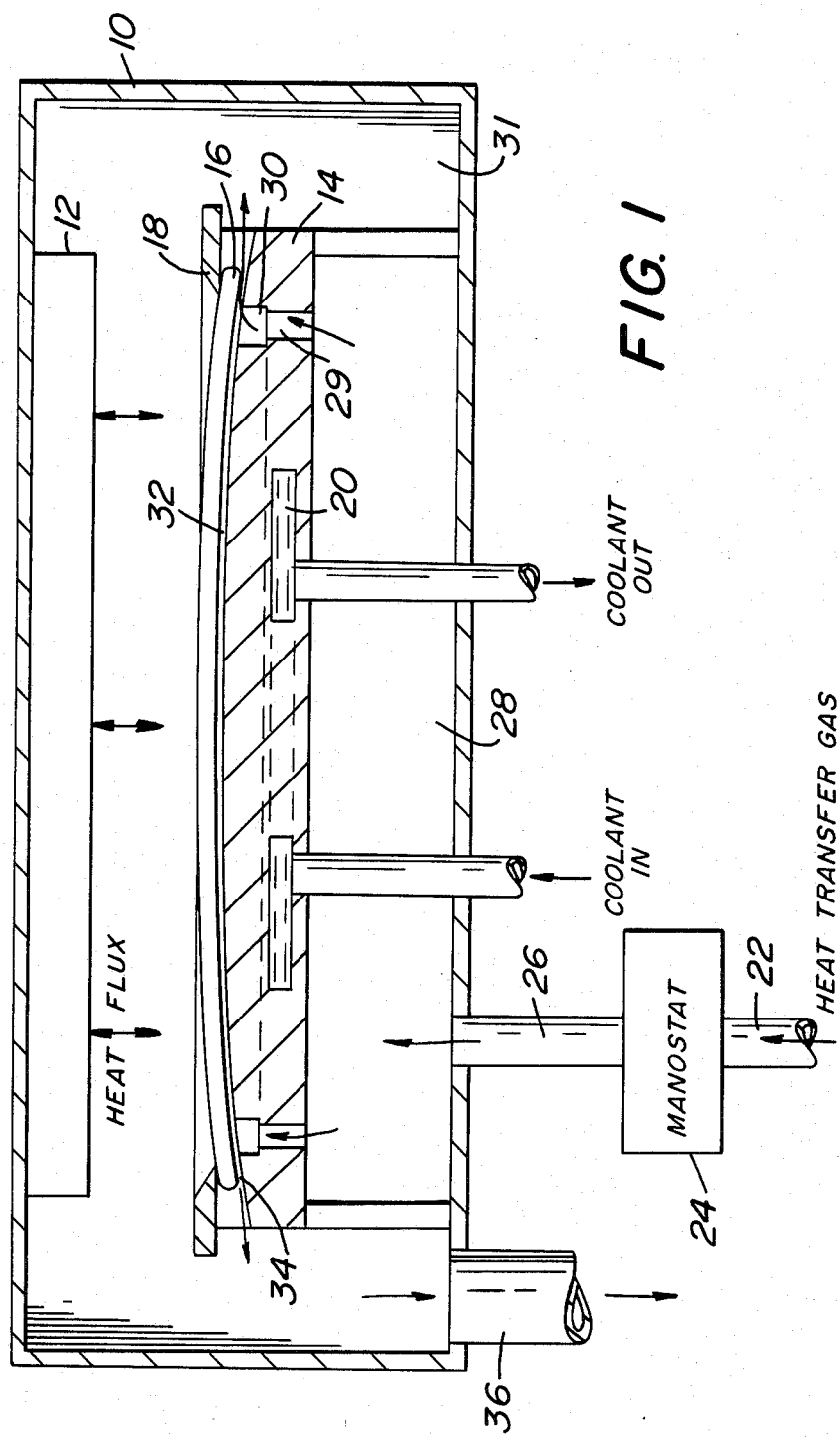
FIG. 1 is a cross-sectional view, partly in block diagram form, illustrating one embodiment of the present invention.

Referring to FIG. 1, a plasma etching system includes a reactor chamber 10 having a plasma gas therein for performing an etching operation. The means for injecting the plasma gas into the chamber, through a counter electrode, for example, are not illustrated. Various means for cooling the counter electrode and many other details relating to the plasma etching system are not illustrated because they are only incidental to the present invention and generally well known to those skilled in the art.

A counter electrode 12 and a domed shaped chuck electrode 14 are disposed within the chamber 10 and adapted to receive a source of R.F. potential (not illustrated). A wafer 16 having a film thereon to be etched is disposed on the chuck electrode 14. A clamping ring 18 clamps the wafer 16 to the chuck electrode 14.

The chuck electrode 14 is fabricated of an electrically conducting material having good thermal conductivity, such as an aluminum alloy or copper. The chuck electrode is shaped in the form of a dome, as illustrated, to minimize the gap between the wafer and chuck electrode when the wafer bows under pressure. The chuck electrode 14 is maintained at some predetermined temperature by a liquid coolant 20 which is circulated through or adjacent to the chuck electrode by any well known conventional means. For example, the cooling could be provided by compressed air cooling with the air flowing at high rates.

A source of heat transfer gas, such as helium or the like, is transferred from a conduit 22 through a manostat or regulator 24, through a conduit 26 into a plenum 28 which is disposed below the chuck electrode 14. The pressure within the chamber 28 may typically be between 5 and 12 torr absolute where it is delivered through an opening 29 to a distribution groove 30 which is close to the periphery of the wafer 16. The dimensions of the groove may be 0.050" wide and 0.070" deep.

The gas from the plenum or chamber 28 may be delivered through the distribution ring groove 30 in the chuck electrode through a number of different means. For example, the opening 29 may represent a number of apertures, e.g., 24 holes of 0.050" diameter, to provide the means for connecting the gas from the chamber 28 to the groove 30. The distribution ring or groove 30 on domed chuck electrode is a feature of the present invention. However the gas is delivered, once it is in the groove 30, it diffuses very rapidly into all of the space of the groove and also into the space between the wafer 16 and the domed chuck electrode 14, however small that space may be. The heat transfer from the area 32 per unit area is independent of the wafer-chuck electrode gap and proportional to the pressure of the gas, as long as the gap or space between the wafer and chuck electrode is less than the molecular mean free path, in practice 0.001" or approximate thereto.

Outboard of the distribution ring 30, gas leaks outward through the small space 34 between the edge of the wafer and the chuck electrode 14, providing heat transfer across said space. The gap 34 is not deliberately introduced into the system. The inevitable space between the chuck electrode and wafer results from surface roughness of the parts and the resultant gas flow through the space is more than adequate. Too great a gap may actually degrade heat transfer although gaps to ~0.001" hurt very little.

The pressure in this area which leads to the process chamber 31 drops rapidly At the edge of the wafer, it reaches process pressure which may be typically 2 torr or less. In tests on 100, 125 and 150 mm wafers, it was found that a typical leak rate for helium was 5-20 standard cc per minute. The lower pressure of the gas under the very edges of the wafer 16 reduces heat transfer, that is cooling, locally. But the wafer thermal conductivity, for example, with a silicon wafer, is sufficient to prevent the edge from getting significantly hotter than the rest of the wafer because of the radial heat flow through the wafer.

It is noted that the dome shape radius of the chuck electrode 14 determines the maximum differential pressure between the gas below the wafer and the process gas. For example, with a 125 mm diameter silicon wafer, 625 $\mu$m thick, a 250" dome radius permits 10 torr differential pressure without lifting the wafer away from the chuck. It was found that it is not necessary and may actually be harmful to deliberately introduce a significant gap, e.g., 0.001" between the wafer and the chuck electrode.

The clamp force applied to the wafer 16 by the clamp ring 18 must be sufficient to conform the wafer to the domed chuck and further sufficient to withstand the differential pressure of the heat transfer gas over the entire wafer area.

As mentioned, many conventional elements of an etching process system are not illustrated because they are not directly related to the invention. For example, a conduit 36 may be connected to a vacuum pump with various throttle valves and process pressure transducers being associated or connected thereto.

Basically, the present invention has provided cooling of the wafer 16 by applying a pressurized gas film between the wafer and the chuck electrode and permitting a gas flow from a pressure source through the space between the wafer edges and the chuck electrode.

In providing cooling for the wafer, it was found that it is important to maintain the pressure of the gas between the wafer and the chuck electrode at some predetermined constant value. This insures that the wafer temperature is maintained as close as possible to the chuck coolant temperature while avoiding lifting the wafer away from the chuck.

While static gas fill provides cooling, it is preferable that flowing gas be used to avoid sealing problems. Mass flow is minimal, however, even when helium is used.

Referring to FIG. 2, some of the elements are similar to those described in connection with FIG. 1. A reactor chamber 38 includes a counter electrode 40 and a chuck electrode 42.

A plenum chamber 48 is provided to receive pressurized gas which is applied to the space 50 between the wafer 44 and chuck electrode 42 through a distribution groove 52. Heat transfer gas leaks out into the process chamber through the space 54 between the chuck and the edge of the wafer.

The basic operation of the various elements described is the same as that described in connection with FIG. 1. The additional elements to be described relate to the means for controlling the pressure in the plenum 48 and thereby the pressure which is applied between the wafer and the chuck electrode. It is generally important that this pressure be maintained relatively constant to assure that the wafer 44 is cooled at the same rate during the entire etching operation and that successive wafers are etched at similar temperatures to provide process consistency.

The process chamber 72 of the reactor 38 is connected to a conduit 56 which acts as a pumping port to a vacuum pump. The gas from the conduit 56 is applied through a throttle valve 58 which is adapted to open and close at appropriate times. A process pressure transducer 60 is used to detect the pressure in the process chamber 72. A servo loop including the process pressure transducer and vacuum throttle valve causes the pressure in the process chamber to be maintained at a constant predetermined value. Various elements relating to throttle valves and pressure transducers are well known to those skilled in the field and therefore not described or illustrated in detail for purposes of clarity.

Gas, which may be helium, is applied to a conduit 62 into a mass flow controller unit 64. A valve 66 is adapted to be opened and closed. When the valve 66 is open, a steady flow of heat transfer gas, typically 10-50 sccm, such as helium, is applied to the system. Some of the gas (typically half) flows to a chamber 48 below the chuck electrode 42 through a conduit 67. The pressure is also applied through a conduit 69 to a housing 71, which includes a steel ball 68 disposed on a steel seat 70. The ball and seat arrangement may be considered as a proportional means for controlling the proportion of gas vented into the process chamber 72.

The pressure under the chuck electrode 42 Pc rises above the process pressure Po until the pressure difference Pc-Po is just sufficient to lift the regulator ball 68 off its seat 70 thus venting excess gas into the process chamber 72. This excessive gas is eventually vented through the conduit 56.

The differential regulator pressure is determined by the seat orifice area and the weight of the ball in one embodiment illustrated.

$$\Delta \cong \frac{(4\pi/3)\rho g\, R^3}{\pi r^2}$$

where
p equals the density of the ball,
g equals acceleration of gravity,
R equals radius of the ball, and
r equals the radius of seat.

The proportion of gas vented to the process chamber varies from wafer to wafer and also during the course of processing, depending on wafer flatness, cleanliness of the chuck and wafers, and wafer temperature.

In one embodiment using a 5/16" diameter stainless steel ball, a seat diameter of 0.21" gives Δp equals or approximately equals to 7 torr. The required pressure is mainly determined by the wafer flexure and dome curvature. Excessive pressure bends the wafer out of contact with the domed chuck electrode 42. Allowable pressures range from 5–12 torr differential, on top of process pressures typically 0.3 to 3 torr absolute. Thus, absolute chuck pressure Pc ranges downward from 15 torr.

A differential pressure sensor 74 is used to verify the correct pressure Pc and detects error conditions such as misaligned wafers, which could result in a below normal pressure and inadequate wafer cooling. A dump valve 76 may be opened at the conclusion of an etching operation at the same time that the valve 66 is closed.

It is important that the heat transfer gas flow through the throttle valve 58 to the process gas pump remain constant at all times during etching, regardless of the wafer flatness and hence regardless of the edge leak rate. The process pressure therefore remains constant, with the partial pressure of heat transfer gas being kept at a fixed (small) fraction of the total pressure. Penetration of heat transfer gas into the actual etching plasma above the wafer occurs only by back diffusion against the process gas flow, and only to a very limited degree.

In the control system of FIG. 2, the total mass flow with two lines leading to the process chamber avoids possible problems associated with variable leaks of heat transfer gas at the wafer periphery.

It is thus seen that the control system described maintains a relatively constant pressure of gas in the area between the chuck electrode and the wafer. Consequently, the temperature of the wafer remains relatively constant thereby assuring a relatively consistent etching process.

In practicing the present invention, the effectiveness of different gases transferring heat under the molecular flow conditions depends on molecule-surface energy accommodation coefficients as well as ordinary thermal conductivity values.

By using the present invention, reticulation (burning) of photoresist is avoided. Also, excessively low chuck temperatures are avoided. Excessively high process gas pressures which are sometimes used to promote wafer cooling are not needed.

The present invention has provided advantages including permitting lower erosion rates of photoresists and hence greater etch rate selectivity to photoresist. Also, the invention described permits enhanced selectivity as to substrate films, such as silicon films in silicon dioxide etching. High etch rates, due to ability to use higher R.F. power densities without excessive wafer temperature are also achieved by the present invention.

What is claimed is:

1. In combination with a plasma etching reactor having a process chamber, including a pair of electrodes, for receiving a process gas therein, with one of said electrodes being a chuck electrode for receiving thereon a wafer having a film to be etched, means for cooling said wafer during operation of said plasma etching reactor comprising:
   means for cooling said chuck electrode;
   means for applying a pressurized gas film between said wafer and said chuck electrode to provide a heat transfer medium between said wafer and said chuck electrode; and
   said chuck electrode being domed shaped to minimize the gap between said wafer and said chuck electrode when said wafer bows under pressure.

2. Means for cooling a wafer as set forth in claim 1 wherein said chuck electrode includes a groove disposed close to the periphery of said wafer for receiving said pressurized gas to provide full heat transfer gas pressure over substantially the entire wafer surface opposite said chuck electrode.

3. Means for cooling a wafer as set forth in claim 2 wherein said groove is ring shaped.

4. Means for cooling a wafer as set forth in claim 3 wherein a clamping ring is provided close to the edges of said wafer to clamp said wafer to said domed chuck electrode, with a relatively small gap being formed between the edges of said wafer and said chuck electrode during operation to limit the gas to flow into said process chamber.

5. In combination with a plasma etching reactor having a process chamber including a pair of electrodes for receiving a process gas therein, with one of said electrodes including a chuck electrode for receiving thereon a wafer having a film to be etched, means for cooling said wafer by pressurized gas during operation and controlling the pressure of said gas comprising:
   (a) a source of gas for applying a pressurized gas film between said wafer and said chuck electrode to provide heat transfer between said wafer and chuck electrodes;
   (b) control means connected between said source of pressurized gas and said process chamber;
   (c) said control means including a proportional means of directing gas either to the space between said wafer and said chuck electrode or to said process chamber; and
   (d) said proportional means being normally closed to prevent said pressurized gas from entering said process chamber and responsive to pressure in excess of a predetermined level to open to cause said pressurized gas to enter said process chamber to thereby maintain relatively constant he gas pressure between said chuck electrode and wafer.

6. The invention as set forth in claim 5 wherein said chuck electrode is cooled by a source of cooling fluid.

7. Means for cooling as set forth in claim 6 wherein said source of pressurized gas includes a chuck plenum chamber for delivering gas to a groove in said chuck electrode disposed close to the periphery of said wafer.

8. Means for cooling as set forth in claim 7 wherein said proportional means comprises a regulator ball on a seat element normally disposed to block said process chamber until the differential pressure between said chuck electrode chamber and said process chamber rises to cause said ball to lift said ball from said seat element.

9. Means for cooling as set forth in claim 8 wherein a pumping port is connected to said process chamber to receive excess gas passing through said proportional means and said process gas.

* * * * *